US008751983B1

(12) United States Patent
Mitchell et al.

(10) Patent No.: US 8,751,983 B1
(45) Date of Patent: Jun. 10, 2014

(54) METHOD FOR DESIGN PARTITIONING AT THE BEHAVIORAL CIRCUIT DESIGN LEVEL

(71) Applicant: Oracle International Corporation, Redwood Shores, CA (US)

(72) Inventors: Thomas Mitchell, Austin, TX (US); Krishnan Sundaresan, Sunnyvale, CA (US); Quan Tran, Redwood Shores, CA (US); Yibin Xia, Redwood Shores, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/789,192

(22) Filed: Mar. 7, 2013

(51) Int. Cl.
*G06F 17/50* (2006.01)
(52) U.S. Cl.
CPC .......... *G06F 17/5045* (2013.01); *G06F 17/505* (2013.01)
USPC .......................................... 716/105; 716/102
(58) Field of Classification Search
None
See application file for complete search history.

(56) References Cited

U.S. PATENT DOCUMENTS

| 8,397,190 | B2 * | 3/2013 | Kenney et al. | 716/106 |
| 8,484,589 | B2 * | 7/2013 | Kenney et al. | 716/105 |
| 8,584,062 | B2 * | 11/2013 | Xia et al. | 716/103 |
| 2006/0053396 | A1 * | 3/2006 | Eng | 716/7 |

* cited by examiner

*Primary Examiner* — Leigh Garbowski
(74) *Attorney, Agent, or Firm* — Osha Liang LLP

(57) ABSTRACT

A design partitioning method and apparatus includes an RTL reader module configured to receive, process, and parse hardware descriptive language of a circuit design; an expression graph module configured to trace identified signal dependencies to determine dependent elements along selected paths within the circuit design; a hierarchy flattener module configured to remove existing circuit design hierarchies based on the identified signal dependencies and determined dependent elements; a partition specification reader module that defines selected paths within the circuit design into a partition specification; a design partitioner module configured to separate the flattened circuit design hierarchy according to the partition specification; a re-partitioner module configured to create a second hierarchical circuit design structure based on the separated, flattened circuit design hierarchy that is behaviorally identical to the circuit design; and an RTL design write-out module configured to output the second hierarchical circuit design structure for analysis.

20 Claims, 17 Drawing Sheets

```
module A_Mod (a, b, c,d, clk, o1, o2);
   input a, b, c, d;
   output o1, o2;
   wire a_and_b, c_or_d, int_nand;
   reg q;
   assign a_and_b = a & b;
   assign c_or_d = c | d;
   assign o1 = a_and_b ^ c_or_d;
   assign int_nand = a_and_b !& c_or_d;
   always @(posedge clk)
      q <= int_nand;
   assign o2 = q;
endmodule
```

Figure 5

```
// Store Performance Queue
// Function:
// Handles the sequencing of performing stores, including the initial request
...
`define LSU_DEFINES_DD
// LRB Related Defines
`define LRBRAM_WIDTH_DD        135
... deleted lines
module lsu_spq_ctl (
  l2clk,
  lex_pa_l2hash_en_c1,
... deleted lines
  lsu_stq_done_dealloc_tid_c8);
wire l1clk_free;
wire rsp_v_l2c6;
... deleted lines
  // Clock
  input      l2clk;          // Main Clock
  input      lex_pa_l2hash_en_c1;       // PA L2 Hash enabled
... deleted lines
  assign rsp_retry_stom_l2c7 =
         (l2d_st_retry_mq_id_v_c7   &  // MQ ID type store retry, AND
         ~rsp_retry_omiss_l2c7      &  // Not an OMISS, AND
         mq_id_is_omiss_entry_l2c7 );  // MQ ID is one of the omiss entries
... deleted lines
  // SQGLL: Store Queue Global Linked List
  //-----------------------------------------------------------
  // 64 entry
  //   1 Read  Port
  //   1 Write Port
  // Contents:
  //   nsqtag[5:0] : pointer to next youngest entry in linked list
  //   ntid[2:0]   : Thread ID for the next youngest entry in linked list
  // 64 entries X 9 bits/entry = 576 bits
  msff_ctl_macro__width_576
  sqgll_state_msff
      (.din ({
          sqgll_nsqtag_ns[0][5 : 0], sqgll_ntid_ns[0][2 : 0],
          sqgll_nsqtag_ns[1][5 : 0], sqgll_ntid_ns[1][2 : 0],
... deleted lines
endmodule // lsu_spq_ctl
... deleted lines
module msff_ctl_macro_width_576 ( din,
... deleted lines
// Decode 3 bit encoded value into a one-hot 8-bit
vector function [7 : 0] dec8;
    input [2 : 0]       in;
    begin
       dec8[0] = (in[2 : 0] == 3'd0);
       dec8[1] = (in[2 : 0] == 3'd1);
... deleted lines
<EOF>
```

Figure 14

| Statistic | Original Circuit | Partitioned Circuit |
|---|---|---|
| Number of Lines | 36773 | 1076 |
| Number of Wires | 1270 | 30 |
| Number of Inputs/Outputs | 249 | 19 |
| Number of Assigns | 1965 | 79 |
| Number of State Elements | 3257 | 592 |
| Number of Functions | 19 | 1 |
| Design Flow Runtime | 78 min | 16 min |

Figure 15

METHOD FOR DESIGN PARTITIONING AT THE BEHAVIORAL CIRCUIT DESIGN LEVEL

BACKGROUND OF INVENTION

1. Field of the Invention

One or more embodiments of the present invention relate generally to a method for design partitioning at the behavioral circuit design level whereas hardware description language (HDL) of a design is processed according to partition specifications.

2. Background Art

Microelectronic circuits may consist of many million transistors and other electronic elements as a direct result of ever decreasing feature size and added circuit functionality. At the same time the processing steps required to manufacture such electronic circuits have increased as well, leading to longer manufacturing cycles. Consequently, to avoid any unnecessary delay in getting a new product to market, it is of utmost importance that the microelectronic circuits are well-designed and that any potential timing weakness has been identified and rectified before actual lithographic masks are produced.

The particular design specialty that is concerned with functional verification and timing verification is referred to as physical design and verification. There are several aspects of the microelectronic circuit design that present challenges to physical design and verification. One of these challenges results from the constrained amount of physical space that is allocated on a silicon wafer for an individual silicon die. As the cost for purchasing and processing a silicon wafer is essentially fixed, it is largely the individual silicon die size that determines how many chips can be obtained from a single wafer. The smaller the individual silicon die size, the more chips fit physically on a single wafer and thus, the average price per individual silicon die decreases.

To minimize the die size, floorplanning is concerned with the optimal physical placement of circuit design sections. However, optimal placement and routing from a purely geometric perspective results in hierarchies which are non-optimized from a timing verification perspective. The hierarchies obtained this way can result in circuits which are too large for the special tools used in design verification because the design verification processing time increases significantly with increasing circuit size.

SUMMARY OF INVENTION

In one or more embodiments, the present invention relates to a method for performing design partitioning at the behavioral circuit design level comprising: receiving, processing, and parsing hardware descriptive language of a circuit design; tracing identified signal dependencies to determine dependent elements along selected paths within the circuit design; removing existing circuit design hierarchies based on the identified signal dependencies and determined dependent elements; defining selected paths within the circuit design; wherein the selected paths are traced from inputs to outputs and vice versa according to a partition specification; separating a flattened circuit design hierarchy according to the partition specification; creating a second hierarchical circuit design structure based on the separated, flattened circuit design hierarchy that is behaviorally identical to the circuit design; and outputting the second hierarchical circuit design structure for analysis.

In one or more embodiments, the method may be performed in selected modes comprising: single-threaded or multi-threaded execution modes; execution by a CPU, a GPU, other processor, or any combination thereof; execution in serial processing mode, in parallel processing mode, or in combination thereof; and execution in partitioning mode or in input duplicating mode.

In one or more embodiments, the method may further comprise: receiving and processing register transfer level (RTL) code representing the circuit design is performed separately from parsing the behavioral representation of the circuit design to identify signal dependencies within the circuit design.

In one or more embodiments, the method may further comprise: accepting a hardware description language input model and operating on a register-transfer-level (RTL) or network of nodes; receiving analog, digital, or mixed analog-and-digital RTL representations; accepting combinational, sequential, or mixed combinational-and-sequential networks; operating on a synchronous, asynchronous, or mixed synchronous-and-asynchronous networks; accepting a single or a plurality of HDL files containing RTL circuit design information; receiving RTL circuit design information from a character scanner; and operating on the RTL circuit design information provided by dedicated input files or from a database.

In one or more embodiments, the method may further comprise: performing the trace of the signal dependencies separately from performing the trace of the selected paths.

In one or more embodiments, the method may further comprise: translating the hardware description language (HDL) according to a set of predefined rules; translating the hardware description language into an array of program variables; and representing the hardware description language in a graphic-equivalent software model.

In one or more embodiments, the method may further comprise: operating on a single portion thereof, a plurality of portions thereof, or on all of the circuit design.

In one or more embodiments, the method may further comprise: accepting partition specification containing input and output circuit design nodes; accepting partition specification containing instances of circuit design modules; operating on a single partition specification or a plurality of partition specifications; receiving partition specification from input files or a database; and accepting partition specification from a character scanner.

In one or more embodiments, the method may further comprise: writing the RTL output into a single output or in a plurality of outputs; writing the RTL output into data files or as a data streams to a database; displaying the design write-out on a visual display device; routing the RTL output to a printed matter device; and writing the RTL output in distinct coloring and formatting according to a predefined rule or set of rules.

In one or more embodiments, the present invention relates to an apparatus for performing design partitioning at the behavioral circuit design level comprising: an RTL reader module configured to receive, process, and parse hardware descriptive language of a circuit design; an expression graph module configured to trace identified signal dependencies to determine dependent elements along selected paths within the circuit design; a hierarchy flattener module configured to remove existing circuit design hierarchies based on the identified signal dependencies and determined dependent elements; a partition specification reader module that defines selected paths within the circuit design into a partition specification; wherein the expression graph module traces selected paths from inputs to outputs and vice versa according to the partition specification; a design partitioner module configured to separate the flattened circuit design hierarchy according to the partition specification; a re-partitioner module configured to create a second hierarchical circuit design structure based on the separated, flattened circuit design hierarchy that is behaviorally identical to the circuit design; and an RTL design write-out module configured to output the second hierarchical circuit design structure for analysis.

In one or more embodiments, the apparatus may further comprise: an execution sequence order module configured to control an order of execution of individual modules.

In one or more embodiments, individual modules may be operated in selected modes comprising: single-threaded or multi-threaded execution modes; execution by a CPU, a GPU, other processor, or any combination thereof; execution in serial processing mode, in parallel processing mode, or in combination thereof; and execution in partitioning mode or in input duplicating mode.

In one or more embodiments, the RTL reader module comprises: a pre-processor module that receives and processes register transfer level (RTL) code representing a circuit design; and a parser module that parses the behavioral representation of the circuit design to identify signal dependencies within the circuit design.

In one or more embodiments, operation of the pre-processor module comprises: accepting a hardware description language input model and operating on a register-transfer-level (RTL) or network of nodes; receiving analog, digital, or mixed analog-and-digital RTL representations; accepting combinational, sequential, or mixed combinational-and-sequential networks; operating on a synchronous, asynchronous, or mixed synchronous-and-asynchronous networks; accepting a single or a plurality of hardware description language (HDL) files containing RTL circuit design information; receiving RTL circuit design information from a character scanner; and operating on the RTL circuit design information provided by dedicated input files or from a database.

In one or more embodiments, the expression graph module comprises: a first traversal module that performs the trace of the signal dependencies; and a second traversal module that performs the trace of the selected paths.

In one or more embodiments, operation of the expression graph module comprises: translating the hardware description language (HDL) according to a set of predefined rules; translating the hardware description language into an array of program variables; and representing the hardware description language in a graphic-equivalent software model.

In one or more embodiments, the hierarchy flattener module is configured to operate on a single portion thereof, a plurality of portions thereof, or on all of the circuit design.

In one or more embodiments, the partition specification operation comprises: accepting partition specification containing input and output circuit design nodes; accepting partition specification containing instances of circuit design modules; operating on a single partition specification or a plurality of partition specifications; receiving partition specification from input files or a database; and accepting partition specification from a character scanner.

In one or more embodiments, the re-partition module is configured to execute a single re-partition, a plurality of re-partitions, or a full re-partition of the circuit design.

In one or more embodiments, the RTL design write-out module comprises: writing the RTL output into a single output or in a plurality of outputs; writing the RTL output into data files or as data streams to a database; displaying the design write-out on a visual display device; routing the RTL output to a printed matter device; and writing the RTL output in distinct coloring and formatting according to a predefined rule or set of rules.

Other aspects and advantages of the invention will be apparent from the following description and the appended claims.

BRIEF DESCRIPTION OF DRAWINGS

FIG. 5 shows hardware descriptive language (HDL) representation of the simplified electronic circuit in FIG. 4.

FIG. 13b shows a zoomed-in subsection of the schematic for an actual electronic circuit in FIG. 13a.

FIG. 14 shows an RTL code snippet for an actual electronic circuit on which the method for design partitioning at the behavioral circuit design level can operate.

FIG. 15 shows a comparison in various statistical parameters before and after partitioning of the actual electronic circuit in FIG. 13a.

DETAILED DESCRIPTION

Following is a detailed description of specific embodiments of the present invention with reference to the figures. In the figures, several details are presented to further the understanding of the present invention. However, these details may not be required or could be substituted for other details as would be known to one with ordinary skill in the art. In addition, other well-known features have not been described as not to distract from the description of the present invention.

Further, the example electronic circuits and hardware description representations used to describe embodiments of the present invention are simplified versions used for illustrative purposes only. It is to be understood that the present invention, in accordance with one or more embodiments, can operate on any hardware descriptive language of any electronic circuit.

Figure 1:
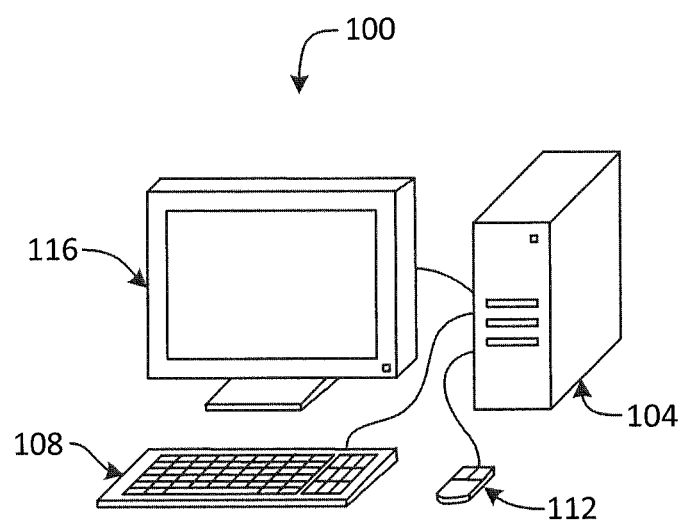
FIG. 1 shows a computing system in accordance with one or more embodiments of the present invention.

FIG. 1 shows a computing system in accordance with one or more embodiments of the present invention. The computing system 100 includes an enclosure 104 containing a motherboard, a processing unit, a data storage device, a network device and a power supply (not explicitly shown). The computing system 100 further includes human interface devices 108 and 112 as well as a visual output device 116. In one or more embodiments of the present invention, the method for design partitioning at the behavioral level is made up of software modules and the order of execution of software modules is controlled by an algorithm embedded in a computing system as described in FIG. 1. Those skilled in the art will appreciate that, in one or more embodiments, the software may be stored on various types of non-transitory computer-readable media, e.g., Blu-ray disk, digital video disk (DVD), compact disk (CD), a diskette, a tape, a hard disk drive, solid-state memory, or any type of read only memory such as EPROM, flash ROM, or any other computer readable storage device.

Certain embodiments of the methods disclosed herein in accordance with one or more embodiments of the invention may be implemented on virtually any type of computer or mobile device regardless of the platform being used. For example, a computer system or mobile device includes one or more processor(s), associated memory (e.g., random access memory (RAM), cache memory, flash memory, etc.), a storage device (e.g., a hard disk, an optical drive such as a compact disk drive or digital video disk (DVD) drive, a flash memory, etc.), and numerous other elements and functionalities typical of today's computers and mobile devices. As used herein, a computer system further includes those systems that employ system of a chip (SoC) architectures, application specific integrated circuits (ASIC), field programmable gate arrays (FPGA), microcontrollers, or the like. The computer system or mobile device may also include input means, such as a keyboard, a mouse, microphone, proximity sensor, or touch sensor/screen. Further, the computer may include output means, such as a monitor (e.g., a liquid crystal display (LCD), a plasma display, or cathode ray tube (CRT) monitor). The computer system may be connected to a network (e.g., a local area network (LAN), a wide area network (WAN) such as the Internet, or any other similar type of network) via a network interface connection. Those skilled in the art will appreciate that many different types of computer and mobile device systems exist, and the aforementioned input and output means may take other forms generally known in the art. Generally speaking, the computer system includes at least the minimal processing, input, and/or output means necessary to practice embodiments of the invention.

Figure 2:
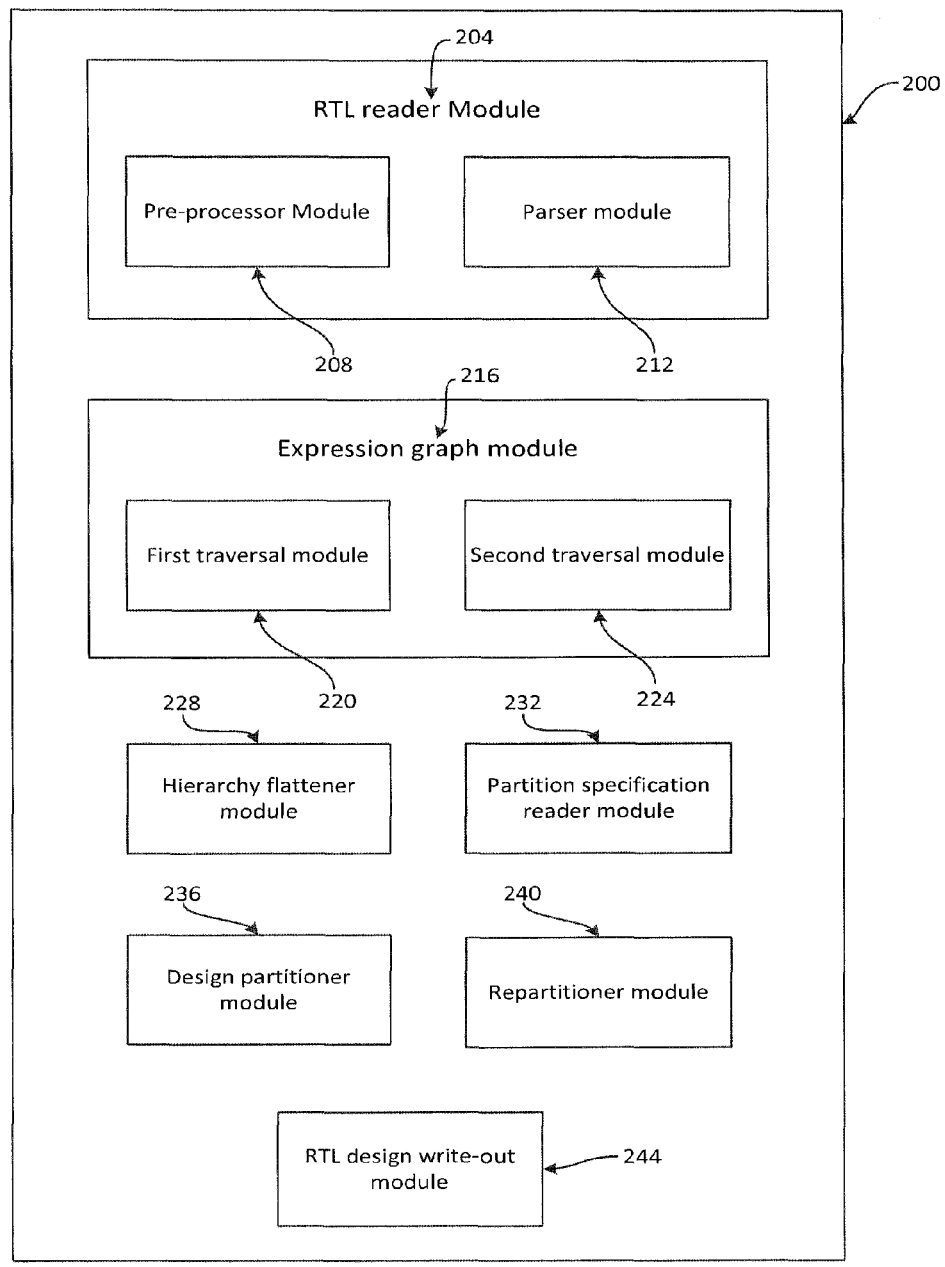
FIG. 2 shows a block diagram of the functional elements in accordance with one or more embodiments of the present invention.

FIG. 2 shows a block diagram of the functional elements in accordance with one or more embodiments of the present invention, wherein element 200 is a method for design partitioning at the behavioral circuit design level. Register-transfer-level (RTL) reader module 204 consists of a pre-processor module 208 to prepare the information supplied by RTL code and a parser module 212 to parse the behavioral representation of the design. Further, expression graph module 216 is composed of a first traversal module 220 to perform the trace of the signal dependencies, and a second traversal module 224 to perform the trace of the selected paths. The method for design partitioning 200 includes further a hierarchy flattener module 228 to flatten a design at the lowest common module level, and a partition specification reader module 232 to receive user partition specifications, also referred to as "cut-lists." Design partitioner module 236 processes the data obtained via the expression graph module 216 and the repartitioner module 240 can be used to establish a different hierarchy in the output. An RTL design write-out module 244 provides write-out for the partitioned alternate design hierarchies.

Figure 3:
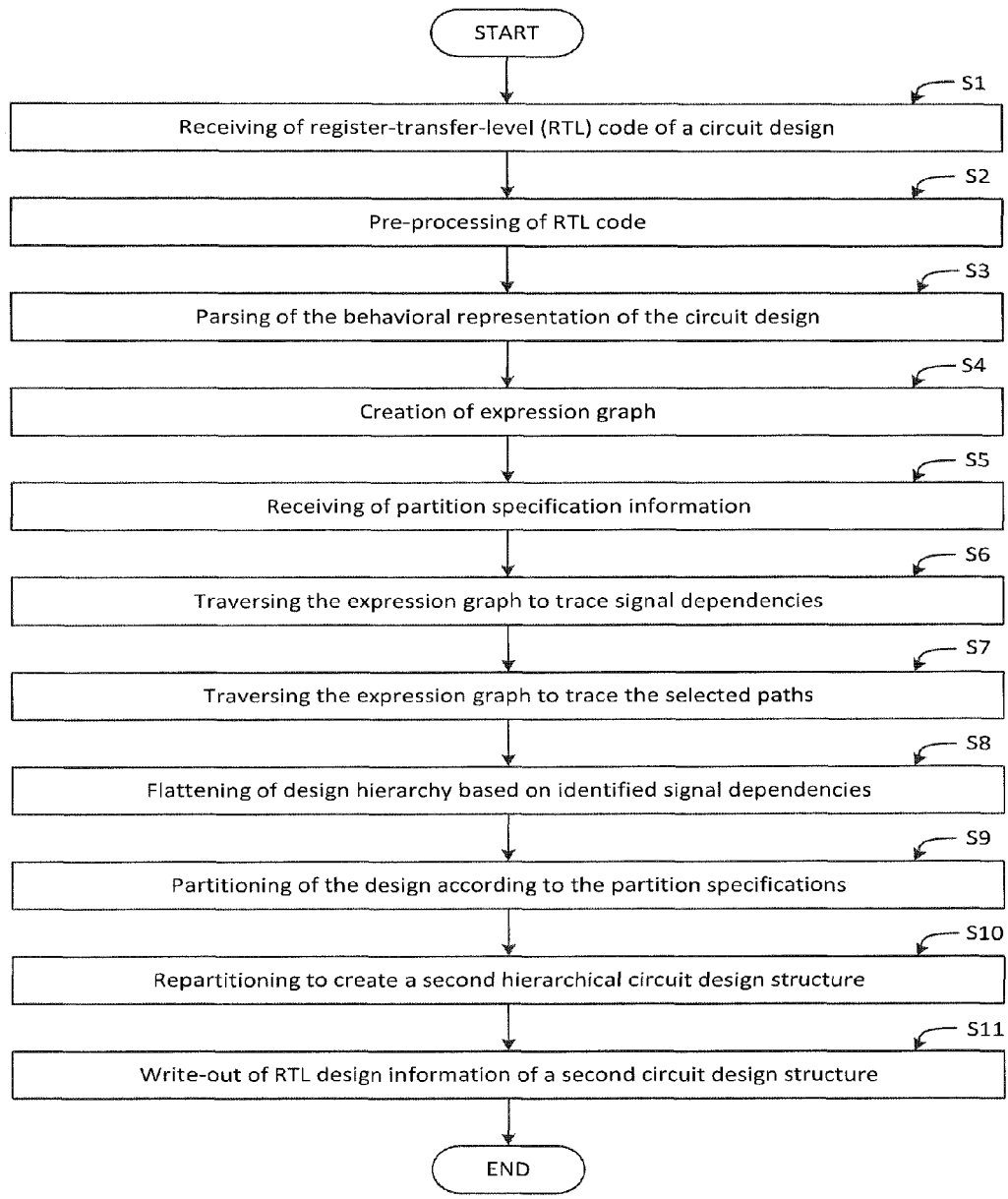
FIG. 3 shows a flow chart indicating the function of the elements in accordance with one or more embodiments of the present invention.

In one or more embodiments, the computing system or computer-readable media contains software, which is made up of instructions executable on a CPU, GPU, or other processor that, when executed, causes the processor to act as the functional elements described, e.g., in FIG. 2, or to perform the method described, e.g., in the flow chart of FIG. 3. Furthermore, those skilled in the art will appreciate that, at user selection, the instructions may be executed in single-threaded or multi-threaded execution modes; by the CPU, the GPU, the other processor, or any combination thereof; in serial processing mode, in parallel processing mode, or in a combination thereof; and in partitioning mode or in input duplicating mode.

Using the flow chart in FIG. 3, the functionality of the individual elements will become apparent according to one or more embodiments of the present invention. In a first step S1, register-transfer-level (RTL) code of a circuit design is received. As the method for design partitioning at the behavioral circuit design level is hardware descriptive language (HDL) agnostic, the circuit design information can also be provided in step S1 via any model of the design such as RTL Verilog/VHDL or ESL SystemC. This RTL code is pre-processed in a second step S2 to prepare the design information for the subsequent parsing of the behavioral representation of the circuit design which occurs in step S3. Using the expression graph module 216 in FIG. 2, an expression graph is created in step S4 which is a software equivalent representation of a circuit design received in step S1. In FIG. 3, step S5, user partition specification information is received from a signal cut-list or a plurality of signal cut-lists. A first traversal of the expression graph from all inputs to all outputs is accomplished using step S6 to identify signal dependencies. Subsequently, according to the partition specification information, the selected paths are traced back from the outputs back to the inputs in step S7. Step S8 provides an option to flatten the design hierarchy to the lowest common level as necessary based on the partition information. Step S9, utilizes the data provided by expression graph module 216 in FIG. 2, and the circuit design is partitioned according to the partition specifications. Repartitioning is accomplished in FIG. 3, step S10 to create a second, alternate hierarchical circuit design structure which is similar to the original circuit design. The new hierarchy is determined by the specific partition(s) selected in the partition specifications. Finally, step S11 includes the write-out of the RTL design information of a second, alternate circuit design structure. The write-out can occur for example to a file or a design database.

Figure 4:
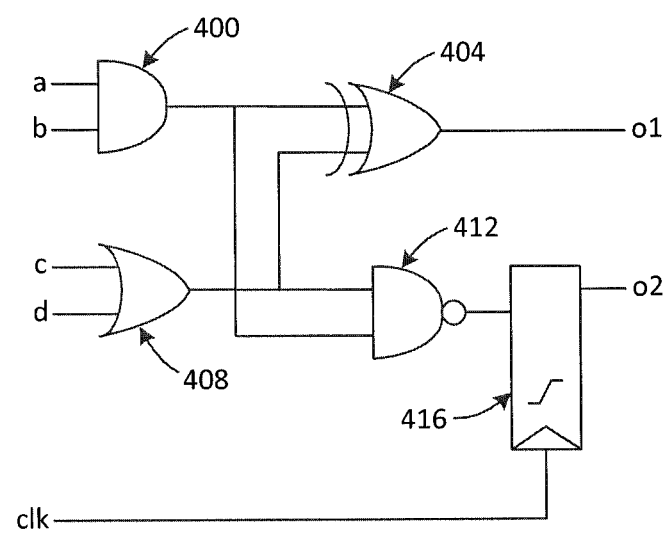
FIG. 4 shows a schematic of a simplified electronic circuit.

In one embodiment of the present invention, a simplified electronic circuit is provided to the method for design partitioning at the behavioral circuit design level. The schematic of this simplified electronic circuit is shown in FIG. 4, in which a, b, c, d and clk are input signals and o1 and o2 are output signals. Input signals a and b are input to an AND gate 400 while input signals c and d are inputs to an OR gate 408. Input signal clk is input to positive-edge triggered D flip-flop 416. Output signal o1 is driven by the output of XOR gate 404 while output signal o2 is provided by positive-edge triggered D flip-flop 416. Flip-flop 416, in turn, receives its input from the output of NAND gate 412. For the sake of completeness, o1 is an asynchronous logic output based on combinational logic while o2 is a clock synchronized output.

The hardware descriptive language (HDL) of the simplified electronic circuit described above is shown in FIG. 5. In this HDL description, the "wire" declaration statement refers to interconnects between AND gate 400, OR gate 408, XOR gate 404 and NAND gate 412. For example "wire a_and_b" declares a variable name (a_and_b) for the logical output (a AND b) of NAND gate 412. The "assign" statement is used to relate a logical operation to a declared variable. For example "assign a_and_b=a & b" produces a logical output (a AND b) of NAND gate 412 and assigns that logical output to a variable (a_and_b). Further in this HDL description is a "reg q" declaration statement. As registers are composed of flip-flops, sometimes flip-flops (e.g. like the one shown in element 416, FIG. 4) are simply referred to as registers and abbreviated as "reg" for HDL purposes. Flip-flop outputs always contain an output "q" and this is reflected in the "reg q" statement which declares that such a register with output "q" exists. The "always @ (posedge clk) q<=int_nand" statement refers to that every single time input signal clk has a positive edge transition (low-to-high), the variable "q" is computed as output of the NAND gate 412. The subsequent "assign o2=q" statement then transfers the content of the internal "q" variable into the output o2. This HDL representation as shown in FIG. 5 is provided to the preprocessor and parser modules.

Figure 6:
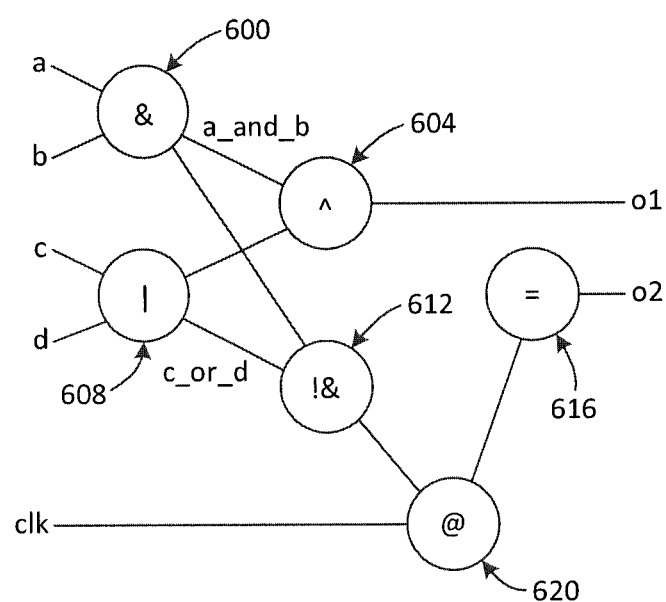
FIG. 6 shows an expression graph representation of the simplified electronic circuit in FIG. 4 in accordance with one or more embodiments of the present invention.

In a further step, the expression graph of the simplified electronic circuitry is created as shown in FIG. 6. The expression graph in this particular embodiment is a software representation using internal variables where the circles in the expression graph are also referred to as "nodes." For example node 600 is the software representation of AND gate 400 in FIG. 4. Similarly for nodes 604, 608 and 612 in FIG. 6, these nodes are software representations of XOR, OR and NAND gates in FIG. 4, respectively. Finally, the positive edge-triggered D flip-flop 416 in FIG. 4, is represented by the combination of the positive clock-edge triggering element 620 and the flip-flop output element 616 ("q") in FIG. 6.

Figure 7:
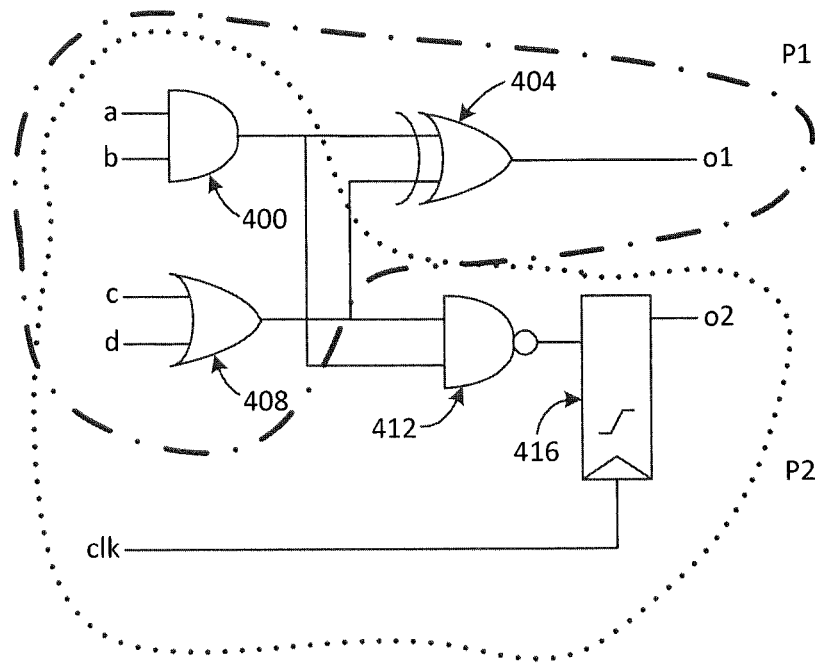
FIG. 7 shows an electronic schematic of the simplified electronic circuit in FIG. 4 overlaid with partition specification information in accordance with one or more embodiments of the present invention.
Figure 8:
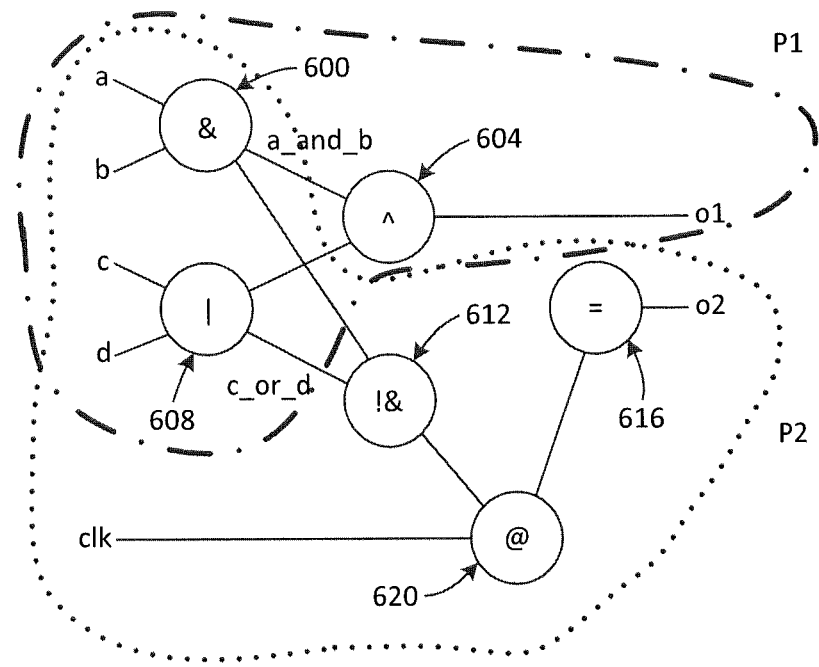
FIG. 8 shows an expression graph representation of the simplified electronic circuit in FIG. 4 overlaid with partition specification information in accordance with one or more embodiments of the present invention.

Using the simplified electronic circuitry, FIG. 7 illustrates receiving of partition information where P1 refers to a first specified partition and P2 refers to a second specified partition. In FIG. 7, partition P1 consists of AND gate 400, XOR gate 404 and OR gate 408. Similarly, partition P2 consists of AND gate 400, OR gate 408, NAND gate 412 and positive edge-triggered D flip-flop 416. The equivalent expression graph representation of the partition specifications is presented in FIG. 8, in which nodes 600, 604 and 608 belong to partition P1 and nodes 600, 608, 612, 616 and 620 are associated with partition P2.

Figure 9:
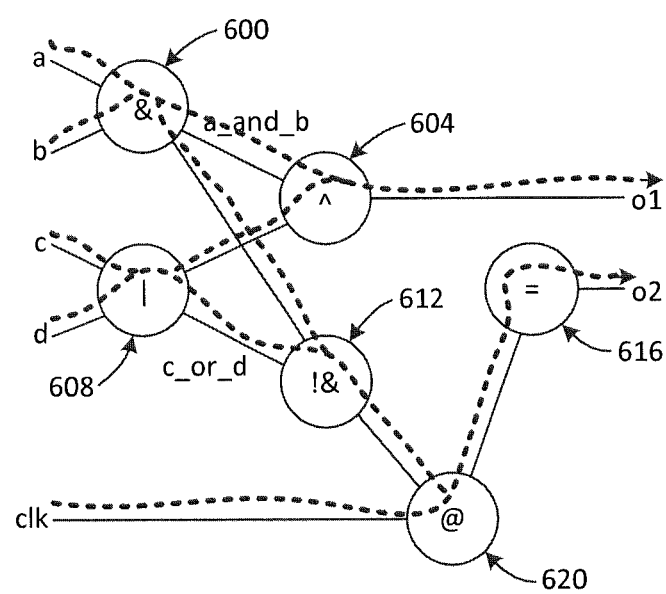
FIG. 9 shows traversing of the expression graph from inputs to outputs in accordance with one or more embodiments of the present invention.
Figure 10:
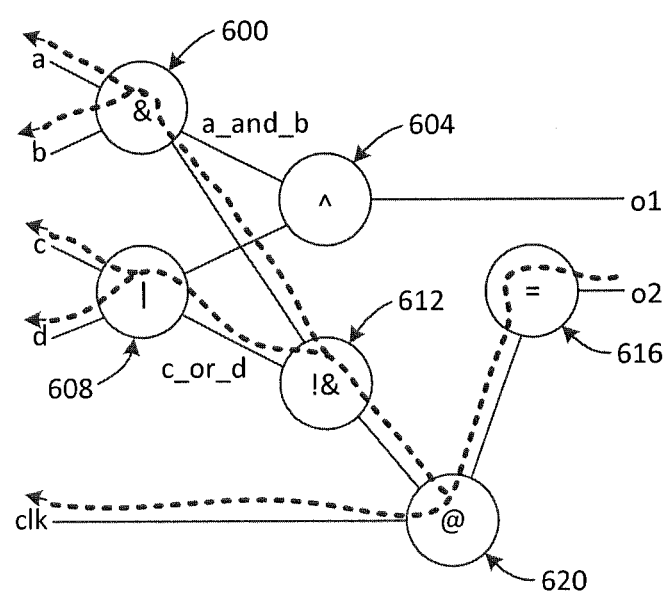
FIG. 10 shows traversing the expression graph from outputs to inputs exemplary for one partition only in accordance with one or more embodiments of the present invention.

FIG. 9 shows traversing of the expression graph from all inputs (a, b, c, d and clk) to all outputs (o1 and o2) through all nodes (600, 604, 608, 612, 616 and 620) in accordance with one or more embodiments of the present invention. This is being done to trace the signal dependencies from all inputs to all outputs. As an example for only a single specified partition P2 of the simplified electronic circuitry, FIG. 10 shows how the expression graph is traversed from output o2 back to the respective inputs (a, b, c, d and clk). Note that nodes marked during both, the forward and the backward traversal (600, 608, 612, 616, 620 but not 604), are the nodes that belong to a specified partition, in this example P2.

Figure 11:
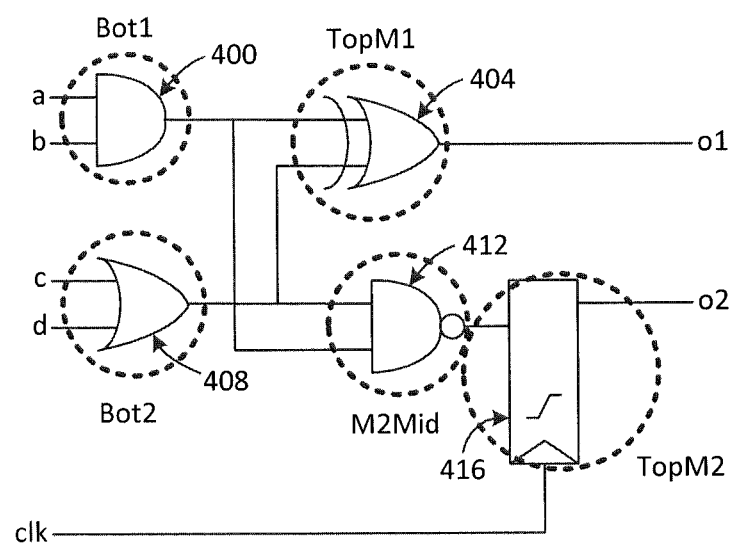
FIG. 11 shows the hierarchy naming convention of instances in the simplified electronic circuit in FIG. 4 in accordance with one or more embodiments of the present invention.

Hierarchical structuring of electronic circuit schematics and layout is one method to simplify working with millions of circuit elements and connections between those elements. Establishing a hierarchy makes it possible to compartmentalize circuit sub-section for easier viewing by ascending/descending in those hierarchies, and also enables potential reuse and copy/pasting of circuit sub-sections. FIG. 11 shows the hierarchy naming convention of instances in the simplified electronic circuit in FIG. 4 in accordance with one or more embodiments of the present invention. Please note that the hierarchical structure for the simplified electronic circuit has been intentionally chosen to consist of several layers to facilitate elaboration of flattening and repartitioning. In FIG. 11, each of Bot1, Bot2, M2Mid, TopM1, and TopM2 represents an instance in the underlying circuit schematic and physical layout. For example, Bot1 is the schematic and layout instance for AND gate 400. Similarly, for TopM1, Bot2, M2M1d and TopM2, where these are instances for XOR gate 404, OR gate 408, NAND gate 412 and positive clock edge-triggered D flip-flop 416, respectively. As needed, instances can be flattened internally and connected elements that may be in different hierarchies are repartitioned into a single hierarchy in the output.

Figure 12A:
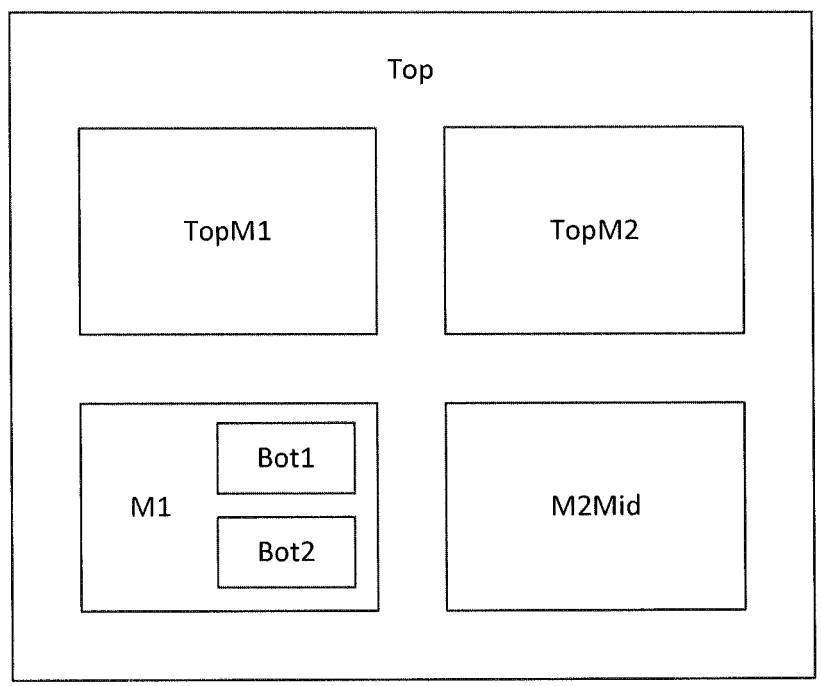
FIG. 12a shows the original design hierarchy of instances in the simplified electronic circuit in FIG. 4 in accordance with one or more embodiments of the present invention.
Figure 12B:
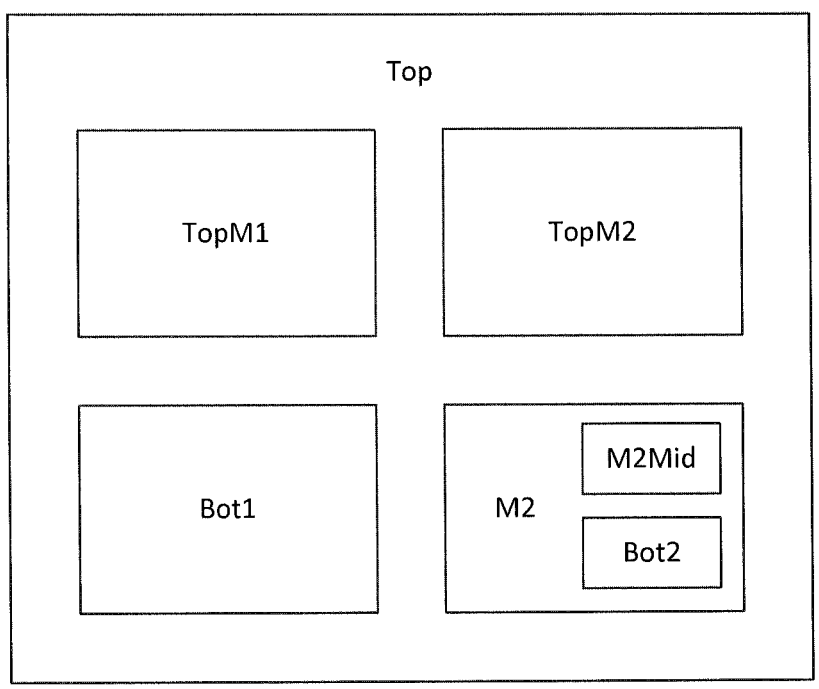
FIG. 12b shows the modified design hierarchy of instances in the repartitioned simplified electronic circuit in FIG. 4 in accordance with one or more embodiments of the present invention.

FIG. 12a shows the original design hierarchy of instances with reference to the simplified electronic circuit in FIG. 11, in accordance with one or more embodiments of the present invention. FIG. 12a illustrates that Bot1 and Bot2 are within the hierarchy M1. M1, M2mid, TopM1 and TopM2, themselves, belong to hierarchy Top. When partitioning across different instances is requested, the original design is first flattened at the lowest common instance level and then partitioning is applied to the flattened design. This is the case in the example where partitioning for output o2 is requested and FIG. 12b shows the modified design hierarchy of instances in the repartitioned, simplified electronic circuit in FIG. 4 in accordance with one or more embodiments of the present invention. In FIG. 12b, instance M1 has been flattened so that Bot1 resides under Top while repartitioning has created a new hierarchy M2 under Top which now contains M2Mid and Bot2.

Figure 13A:
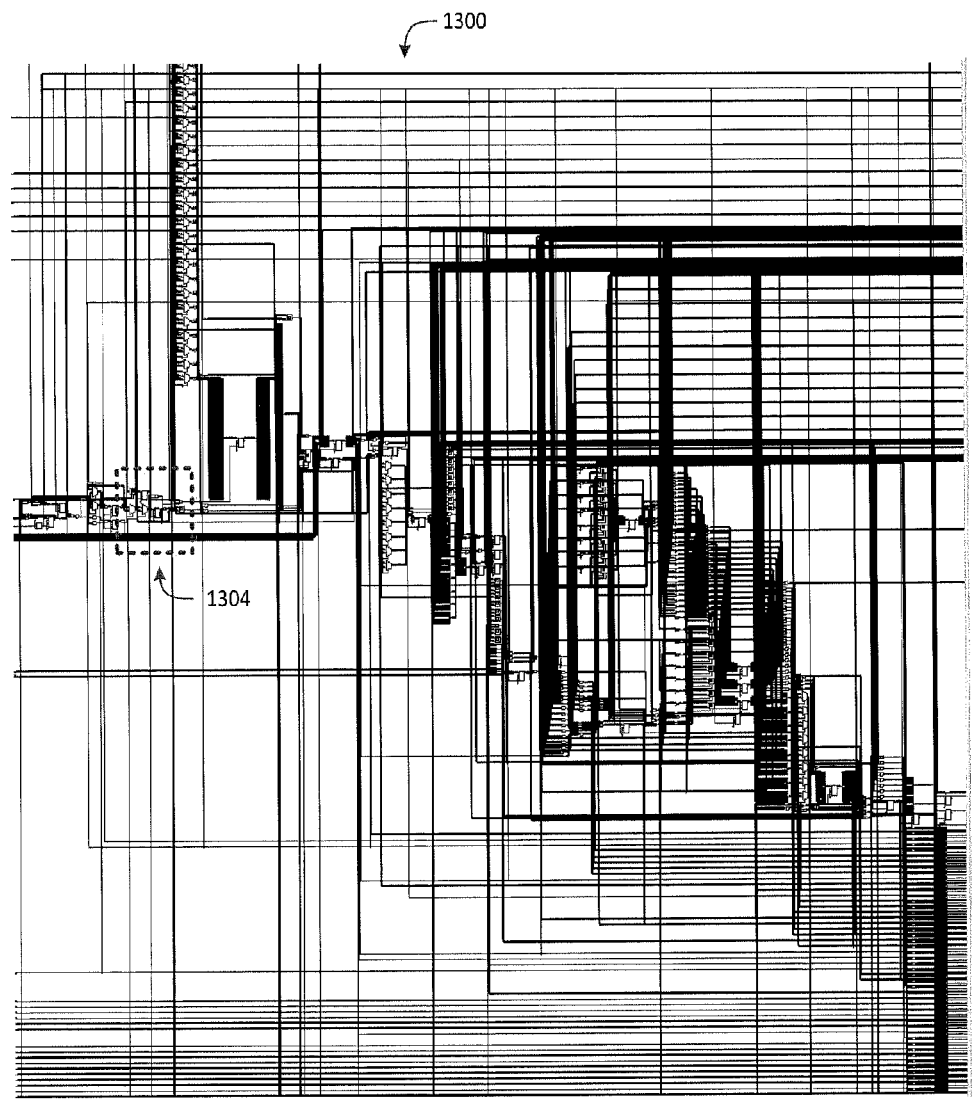
FIG. 13a shows a top-level schematic view for an actual electronic circuit on which the method for design partitioning at the behavioral circuit design level can operate.
Figure 13B:
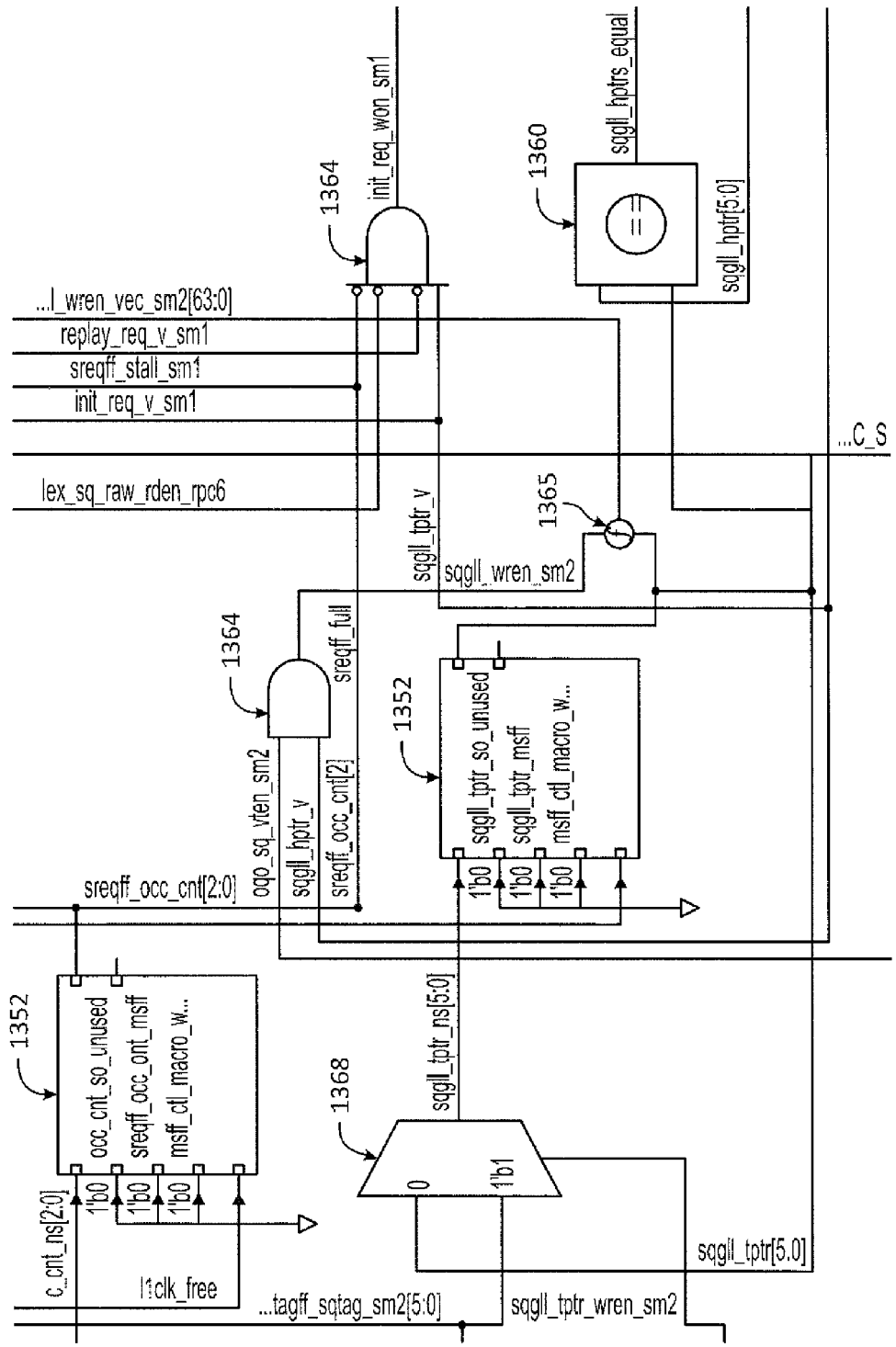

FIG. 13a shows a high-level top view 1300 for an actual electronic circuit on which the method for design partitioning at the behavioral circuit design level can operate. The high-level top view provides an understanding of circuit complexity, as more than 3000 state elements are contained in the schematic in FIG. 13a. However, as those skilled in the art will readily appreciate, at the high-level top view shown, nearly none of the individual state elements can be seen. In FIG. 13a, element 1304 refers to a small zoomed-in subsection, which is shown magnified in FIG. 13b, wherein elements 1352, 1356, 1360, 1364, and 1368 refer to a flip-flop array, a decoder, a comparator, an AND gate, and a multiplexer respectively. All five elements are displayed in their hierarchical representation and one would have to descend further into each of them to gain more insight into their sub-circuitry. FIG. 14 shows an RTL code snippet for this actual, non-partitioned electronic circuit as is shown in FIG. 13a. The actual RTL code is more than 36000 lines long and design flow (verification) runtime of this original, non-partitioned electronic circuit is about 78 minutes.

FIG. 15 compares various statistical parameters for the original, non-partitioned electronic circuit in FIG. 13a to a partitioned circuit using the method for design partitioning at the behavioral circuit design. The original, non-partitioned circuitry consists of more than 36000 lines of RTL code with more than 3000 state elements and about 250 inputs/outputs. This original, non-partitioned circuit takes about 78 minutes to complete the design verification flow. The partitioned circuit consists of only about 1100 lines of RTL code with only about 600 state elements and only about 20 input/outputs. As intended, the partitioned circuit takes only about 16 minutes to complete the design verification flow. Consequently, the design verification flow for the partitioned circuit can complete, for instance, 5 iterations in the same time that it would have taken the original, non-partitioned circuit to complete the design verification flow.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for performing design partitioning at the behavioral circuit design level comprising:
   receiving, processing, and parsing hardware descriptive language of a circuit design;
   tracing identified signal dependencies to determine dependent elements along selected paths within the circuit design;
   removing existing circuit design hierarchies based on the identified signal dependencies and determined dependent elements;
   defining selected paths within the circuit design;
   wherein the selected paths are traced from inputs to outputs according to a partition specification;
   separating a flattened circuit design hierarchy according to the partition specification;
   creating a second hierarchical circuit design structure based on the separated, flattened circuit design hierarchy that is behaviorally identical to the hardware descriptive language of the circuit design; and
   outputting the second hierarchical circuit design structure for analysis.

2. The method of claim 1, wherein the method is performed in selected modes comprising:
   single-threaded or multi-threaded execution modes;
   execution by a CPU, a GPU, other processor, or any combination thereof;
   execution in serial processing mode, in parallel processing mode, or in combination thereof; and
   execution in partitioning mode or in input duplicating mode.

3. The method of claim 1 further comprising:
   receiving and processing register transfer level (RTL) code representing the circuit design is performed separately from parsing the behavioral representation of the circuit design to identify signal dependencies within the circuit design.

4. The method of claim 3, further comprising:
   accepting a hardware description language input model and operating on a register-transfer-level (RTL) or network of nodes;
   receiving analog, digital, or mixed analog-and-digital RTL representations;
   accepting combinational, sequential, or mixed combinational-and-sequential networks;
   operating on a synchronous, asynchronous, or mixed synchronous-and-asynchronous networks;
   accepting a single or a plurality of HDL files containing RTL circuit design information;
   receiving RTL circuit design information from a character scanner; and
   operating on the RTL circuit design information provided by dedicated input files or from a database.

5. The method of claim 1, further comprising:
   performing the trace of the signal dependencies separately from performing the trace of the selected paths.

6. The method of claim 1, further comprising:
   translating the hardware description language (HDL) according to a set of predefined rules;
   translating the hardware description language into an array of program variables; and
   representing the hardware description language in a graphic-equivalent software model.

7. The method of claim 1, further comprising:
   operating on a single portion thereof, a plurality of portions thereof, or on all of the circuit design.

8. The method of claim 1, further comprising:
   accepting partition specification containing input and output circuit design nodes;
   accepting partition specification containing instances of circuit design modules;
   operating on a single partition specification or a plurality of partition specifications;
   receiving partition specification from input files or a database; and
   accepting partition specification from a character scanner.

9. The method of claim 1, further comprising:
   writing the RTL output into a single output or in a plurality of outputs;
   writing the RTL output into data files or as a data streams to a database;
   displaying the design write-out on a visual display device;
   routing the RTL output to a printed matter device; and
   writing the RTL output in distinct coloring and formatting according to a predefined rule or set of rules.

10. An apparatus for performing design partitioning at the behavioral circuit design level comprising:
    an RTL reader module configured to receive, process, and parse hardware descriptive language of a circuit design;
    an expression graph module configured to trace identified signal dependencies to determine dependent elements along selected paths within the circuit design;
    a hierarchy flattener module configured to remove existing circuit design hierarchies based on the identified signal dependencies and determined dependent elements to produce a flattened circuit design;
    a partition specification reader module that defines selected paths within the circuit design into a partition specification;
    wherein the expression graph module traces selected paths from inputs to outputs according to the partition specification;
    a design partitioner module configured to separate the flattened circuit design hierarchy according to the partition specification;
    a re-partitioner module configured to create a second hierarchical circuit design structure based on the separated, flattened circuit design hierarchy that is behaviorally identical to the hardware descriptive language of the circuit design; and
    an RTL design write-out module configured to output the second hierarchical circuit design structure for analysis.

11. The apparatus of claim 10 further comprising:
    an execution sequence order module configured to control an order of execution of individual modules.

12. The apparatus of claim 10, wherein individual modules are operated in selected modes comprising:
    single-threaded or multi-threaded execution modes;

execution by a CPU, a GPU, other processor, or any combination thereof;
execution in serial processing mode, in parallel processing mode, or in combination thereof; and
execution in partitioning mode or in input duplicating mode.

13. The apparatus of claim 10, wherein the RTL reader module comprises:
a pre-processor module that receives and processes register transfer level (RTL) code representing a circuit design; and
a parser module that parses the behavioral representation of the circuit design to identify signal dependencies within the circuit design.

14. The apparatus of claim 10, wherein operation of the pre-processor module comprises:
accepting a hardware description language input model and operating on a register-transfer-level (RTL) or network of nodes;
receiving analog, digital, or mixed analog-and-digital RTL representations;
accepting combinational, sequential, or mixed combinational-and-sequential networks;
operating on a synchronous, asynchronous, or mixed synchronous-and-asynchronous networks;
accepting a single or a plurality of hardware description language (HDL) files containing RTL circuit design information;
receiving RTL circuit design information from a character scanner; and
operating on the RTL circuit design information provided by dedicated input files or from a database.

15. The apparatus of claim 10, wherein the expression graph module comprises:
a first traversal module that performs the trace of the signal dependencies; and
a second traversal module that performs the trace of the selected paths.

16. The apparatus of claim 10, wherein operation of the expression graph module comprises:
translating the hardware description language (HDL) according to a set of predefined rules;
translating the hardware description language into an array of program variables; and
representing the hardware description language in a graphic-equivalent software model.

17. The apparatus of claim 10, wherein the hierarchy flattener module is configured to operate on a single portion thereof, a plurality of portions thereof, or on all of the circuit design.

18. The apparatus of claim 10, wherein the partition specification operation comprises:
accepting partition specification containing input and output circuit design nodes;
accepting partition specification containing instances of circuit design modules;
operating on a single partition specification or a plurality of partition specifications;
receiving partition specification from input files or a database; and
accepting partition specification from a character scanner.

19. The apparatus of claim 10, wherein the re-partition module is configured to execute a single re-partition, a plurality of re-partitions, or a full re-partition of the circuit design.

20. The apparatus of claim 10, wherein the RTL design write-out module comprises:
writing the RTL output into a single output or in a plurality of outputs;
writing the RTL output into data files or as data streams to a database;
displaying the design write-out on a visual display device;
routing the RTL output to a printed matter device; and
writing the RTL output in distinct coloring and formatting according to a predefined rule or set of rules.

\* \* \* \* \*

UNITED STATES PATENT AND TRADEMARK OFFICE
CERTIFICATE OF CORRECTION

PATENT NO. : 8,751,983 B1
APPLICATION NO. : 13/789192
DATED : June 10, 2014
INVENTOR(S) : Mitchell et al.

It is certified that error appears in the above-identified patent and that said Letters Patent is hereby corrected as shown below:

In the Specification

In column 8, line 18, delete "M2M1d" and insert -- M2Mid --, therefor.

In column 8, line 28, delete "M2mid," and insert -- M2Mid, --, therefor.

Signed and Sealed this
Third Day of February, 2015

Michelle K. Lee
*Deputy Director of the United States Patent and Trademark Office*